(12) United States Patent
Brülhart et al.

(10) Patent No.: US 6,259,306 B1
(45) Date of Patent: Jul. 10, 2001

(54) CONTROL SYSTEM FOR A BIDIRECTIONAL SWITCH WITH TWO TRANSISTORS

(75) Inventors: Marcel Brülhart, Cudrefin; Stéphane Trillat, Neuchâtel, both of (CH)

(73) Assignee: EM Microelectronic, Marin SA (CH)

( * ) Notice: Subject to any disclaimer, the term of this patent is extended or adjusted under 35 U.S.C. 154(b) by 0 days.

(21) Appl. No.: 09/638,558

(22) Filed: Aug. 14, 2000

(30) Foreign Application Priority Data

Aug. 20, 1999 (CH) .................................................... 1530/99

(51) Int. Cl.[7] .............................................. H03K 17/687
(52) U.S. Cl. ............................................ 327/436; 327/434
(58) Field of Search ................................. 327/427, 434, 327/435, 436, 437, 389

(56) References Cited

U.S. PATENT DOCUMENTS

| 5,138,186 | * | 8/1992 | Dumbovic | 327/434 |
| 5,574,633 | | 11/1996 | Prater | 363/59 |
| 5,610,495 | | 3/1997 | Yee et al. | 320/6 |
| 5,764,032 | | 6/1998 | Moore | 320/126 |
| 5,789,902 | | 8/1998 | Abe et al. | 320/134 |
| 5,909,103 | | 6/1999 | Williams | 320/134 |
| 6,163,199 | * | 12/2000 | Miske et al. | 327/427 |

FOREIGN PATENT DOCUMENTS

| 195 48 612 A1 | 6/1997 | (DE) . |
| 0 525 744 A1 | 2/1993 | (EP) . |
| 0 660 520 A2 | 6/1995 | (EP) . |

OTHER PUBLICATIONS

Williams, Richard K., et al., The Bidirectional Power NMOS—A New Concept in Battery Disconnect Switching, Proceedings of 1995 International Symposium on Power Semiconductor Devices & ICs, (ISPSD), US, New York, IEEE, vol. SYMP 7, pp. 480 through 485.

* cited by examiner

Primary Examiner—Toan Tran
(74) Attorney, Agent, or Firm—Richard K Robinson

(57) ABSTRACT

A control system for a bidirectional switch (20) is described, formed of a pair of MOFSET power transistors (210, 220) connected in anti-series, i.e. source to source or drain to drain. This control system includes means (50) allowing the state of conduction of the power transistors to be controlled, one or the other of these transistors being able to be set to the "OFF" state in order to assure the interruption of a current through the bidirectional switch (20). This control system includes coupling means ($SW_{CPL}$, 510) enabling the gate of the power transistor at the "ON" state to be coupled at least temporarily with the gate of the power transistor at the "OFF" state when the bidirectional switch is switched on. This has the advantage of allowing, on the one hand, the use of high control voltages assuring a reduction in the series resistance of the power transistors, and, on the other hand, the bidirectional switch to be quickly switched on.

8 Claims, 5 Drawing Sheets

CONTROL SYSTEM FOR A BIDIRECTIONAL SWITCH WITH TWO TRANSISTORS

The present invention relates to a control system for a bidirectional switch for current monitoring circuits, in particular current monitoring circuits suitable for controlling the charge and discharge of rechargeable batteries. More particularly, the present invention concerns a control system for a bidirectional switch formed of a pair of MOFSET power transistors connected in anti-series, i.e. source to source or drain to drain.

Circuits allowing the bidirectional flow of a current to be controlled are used in numerous applications. Such circuits are used in particular to control the charge and discharge of rechargeable batteries (lithium, lithium-ion batteries, etc.), assuring the power supply of portable devices of various types (telephones, lap-top computers, timepieces, etc.).

It is known that rechargeable batteries of this type require protection against inadequate operating conditions (overcharging or undercharging of the battery, too high charging or discharging currents, too high operating temperature, etc.) which can appear when a load or charger is connected to the battery or during a short-circuit of the battery terminals. This protection is necessary to assure that the battery performance is not adversely affected.

These current monitoring circuits thus typically include current interruption means which are placed in series in the battery current path and respond to signals indicative of inadequate operating conditions, in order to interrupt the continuation of the charging or discharging of the battery or, generally, in order to interrupt the flow of a current in the battery which could have an adverse affect on the performance thereof. These current interruption means are commonly formed of switches made by means of MOFSET power transistors and controlled by circuits monitoring the level of charge or discharge of the battery, the value of the current passing through it or the battery temperature.

In numerous applications, these interruption means are formed of a switch including a pair of MOFSET power transistors connected in anti-series, i.e. connected source to source or alternatively drain to drain. FIGS. 1a to 1c illustrate three examples of such a bidirectional switch with two transistors. FIG. 1a illustrates a pair of N-MOFSET transistors connected source to source, FIG. 1b illustrates a pair of N-MOFSET transistors connected drain to drain, and FIG. 1c illustrates a pair of P-MOFSET transistors connected source to source. Of course, a fourth solution, which is not illustrated here, consists in connecting a pair of P-MOFSET transistors drain to drain. This type of switch is commonly called a "bidirectional switch" since it allows the current to be blocked as well as to flow in two directions.

In normal operation, the two transistors are at the "ON" state and a current can flow in both directions between terminals X and Y through the switch. When an inadequate operating condition is detected, one or the other of the transistors is set to the "OFF" state in order to block the flow of current in the battery. It will be noted however that the current can still flow in the opposite direction through a parasitic diode or "body diode" formed between the drain and the source of each MOFSET power transistor, this parasitic diode being due to the fact that the substrate ("body") and the source of the power transistor are connected together at the same potential.

Each transistor thus allows the current to be blocked in one direction while allowing a current to flow in the opposite direction through its parasitic diode. Used in a rechargeable battery charge and discharge monitoring circuit, one of the transistors thus allows the battery charging current to be interrupted, while the other transistor allows the discharge current in the opposite direction to be interrupted.

There are two determining factors when such a bidirectional switch is selected and made. One the one hand, one wishes to limit as much as possible the value of the series resistance (or conduction resistance) $R_{DS\_ON}$ of the bidirectional switch. On the other hand, one wishes to minimise as much as possible the time necessary for making the bidirectional switch conduct, hereinafter referred to as conduction delay time.

These two purposes are in fact intimately linked and opposite. Indeed, in order to reduce series resistance $R_{DS\_ON}$ of the bidirectional switch, the transistors need to be controlled with relatively high gate voltages, typically of the order of 10 to 15 volts between the gate and the source of the transistor. The power transistors must thus necessarily bear these gate voltages through the gate oxide which consequently has a relatively large thickness and thus a large gate capacitance. This high gate capacitance thus leads to relatively long transistor conduction delay times.

The shortest possible conduction delay time of the bidirectional switch allows a quick response to changes in conditions detected by the monitoring circuit. This is all the more important since in most applications, these circuits operate in a pulsed manner and must thus respond almost instantaneously to the detected conditions.

One object of the present invention is thus to provide a control system for a bidirectional switch with two transistors which, in particular, allows the two aforementioned opposite purposes to be answered.

The present invention thus concerns a control system for a bidirectional switch with two transistors, whose features are listed in claim 1.

The present invention also concerns a control method for a bidirectional switch with two transistors, whose features are listed in claim 7.

According to the present invention, advantage is taken of the fact that the bidirectional switch is formed of two power transistors mounted in anti-series and that only one of the transistors is set at the "OFF" state when one wishes to interrupt the flow of current through the battery, the other transistor always remaining at the "ON" state.

By coupling the power transistor gates at least temporarily when the transistor at the "OFF" state is made to conduct again, the charge present on the transistor which remained at the "ON" state is shared with the other transistor and it is thus possible to substantially reduce the transistor conduction delay time. It is thus possible to improve the dynamic features of the bidirectional switch, namely essentially its conduction delay time, despite the use of high gate voltages allowing a low series resistance to be obtained for the switch.

Other features and advantages of the invention will appear more clearly upon reading the following detailed description, made with reference to the annexed drawings, which are given by way of non-limiting example and in which:

FIGS. 1a to 1c already mentioned, illustrate three known embodiment examples of a bidirectional switch with two transistors;

Figure 1A:
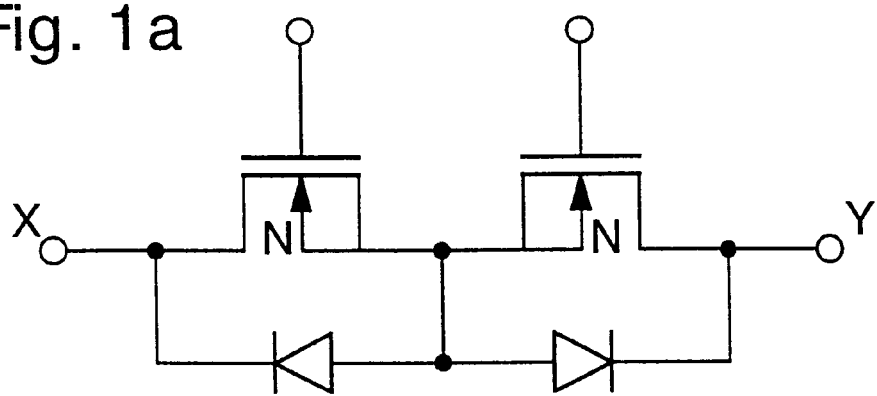
Figure 1B:
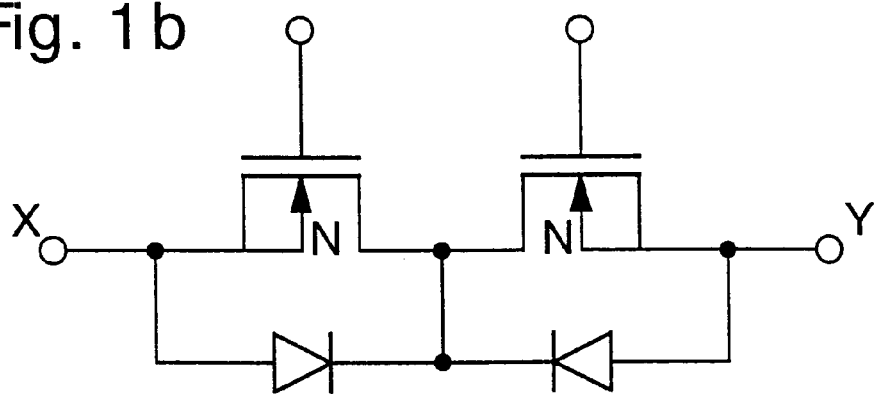
Figure 1C:
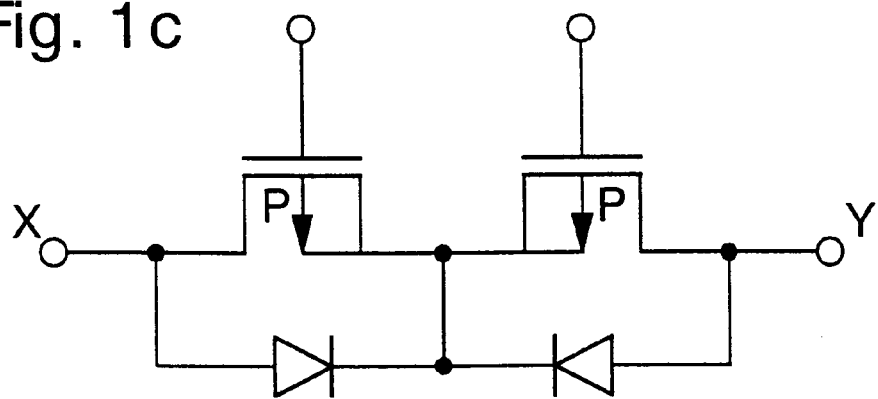
Figure 2:
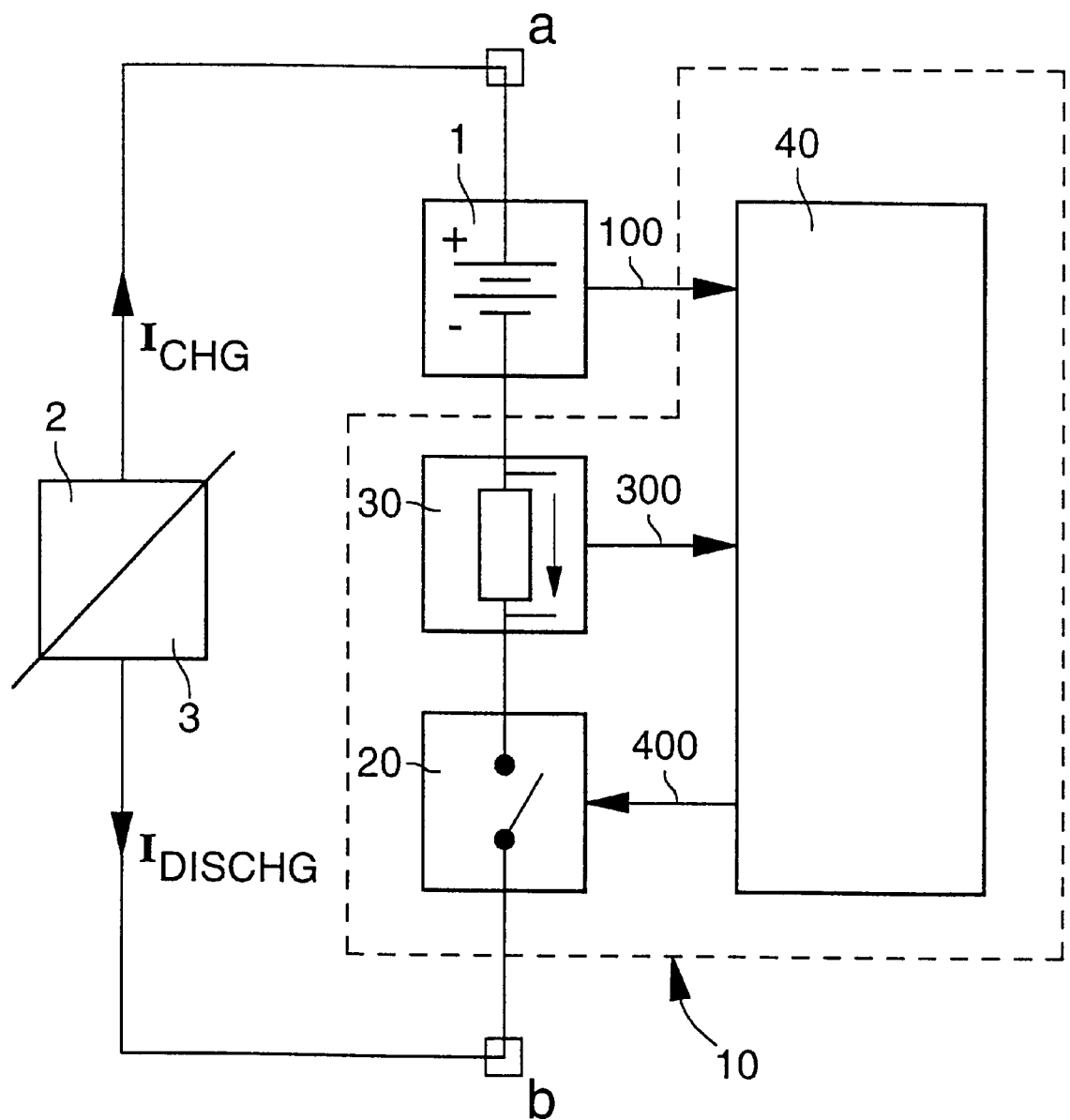
FIG. 2 illustrates a schematic example of a current monitoring circuit or protective circuit a rechargeable battery.

With reference to FIG. 2, a protective circuit 10 for a rechargeable battery 1 is shown. Battery 1 and protective circuit 10 form an assembly including two terminals a and b between which a load 2 or a charger 3 may be connected.

The protective circuit, which can be called more generally current monitoring circuit 10, includes current interruption means, formed of a bidirectional switch 20, and possibly current measuring means 30 arranged in series with battery 1 between terminals a and b of the assembly. Thus, when a charge 2 is connected between terminals a and b of the assembly, a discharge current $I_{DISCHG}$ flows from the positive terminal of battery 1 via a charge 2 and bidirectional switch 20 to the negative terminal of battery 1. When a charger 3 is connected between terminals a and b of the assembly, a charge current $I_{CHG}$ then flows in the opposite direction to discharge current $I_{DISCHG}$.

It is to be noted that measuring means 30 may be made in the form of a measuring resistor supplying a potential drop representing the current passing through it. Bidirectional switch 20 can however also form measuring means 30. In this case, the voltage across the terminals of bidirectional switch 20 is used to evaluate the value of charge current $I_{CHG}$ or discharge current $I_{DISCHG}$ passing through battery 1.

Current monitoring circuit 10 further includes detection and control means 40 coupled to battery 1 and, if necessary, to measuring means 30. Detection and control means 40 receive from battery 1 and measuring means 30 detection signals 100 and 300 respectively representing the level of charge of battery 1 and the value of the current passing through battery 1. In response to these detection signals 100 and 300, detection and control means 40 supply one or more control signals 400 to bidirectional switch 20. The manner in which detection and control means 40 are made will not be described here in detail. It needs only be mentioned here that these means typically include, on the one hand, detection and comparison means allowing, in particular, the voltage across the battery terminals to be compared to different reference voltage levels and to provide in response logic state activation signals, and, on the other hand, control means responding to these activation signals and forming the actual control system for bidirectional switch 20.

In the following description, one will dwell essentially on the description of this control system for bidirectional switch 20.

The operating principle of the control system according to the present invention will now be described with reference to FIG. 3. This Figure illustrates the operating diagram of the control system for a bidirectional switch with two MOFSET power transistors according to the present invention.

Bidirectional switch 20 illustrated in this Figure is formed in this example of a pair of N-MOFSET power transistors 210 and 220 connected source to source. Each of power transistors 210 and 220 includes a parasitic diode ("body diode") 215, 225 formed between the drain and the source of the transistors in parallel to the channel. The drains of power transistors 210 and 220 are connected as described previously so that the bidirectional switch is arranged in the path of the current the flow of which must, if necessary, be interrupted.

In the application example used here by way of non-limiting example, since bidirectional switch 20 is arranged in series in the battery current path (not shown in this Figure), a first current, namely a charge current $I_{CHG}$ is able to flow through bidirectional switch 20 as is indicated by the direction of the arrow in the Figure, and a second current with the opposite direction to the first current, namely a discharge current $I_{DISCHG}$, is able to flow through bidirectional switch 20 as is indicated by the direction of the other arrow.

Gates 211 and 221 of power transistors 210 and 220 are respectively connected to control means 50 supplying first and second gate voltages $V_{GATE\_CHG}$ and $V_{GATE\_DISCHG}$ to gates 211 and 221, respectively of power transistors 210 and 220. When one or the other of these gate voltages $V_{GATE\_CHG}$ and $V_{GATE\_DISCHG}$ is substantially equal to the voltage present at the node formed by the sources of transistors 210 and 220, which is earth here, the corresponding power transistor is made non conductive, i.e. set at the "OFF" state. In order to set these transistors to the "ON" state again, the gate voltage is brought to a level such that the voltage between the gate and the source of the transistor is greater than the threshold voltage (typically from 0.7 to 2.5 volts) of the transistor.

Preferably, as was already mentioned in the preamble of this description, in order to reduce the value of the series resistance $R_{DS\_ON}$ (or the conduction resistance) of each of power transistors 210 and 220, gate voltages $V_{GATE\_CHG}$ and $V_{GATE\_DISCHG}$ are preferably brought to levels such that the gate-source voltage of each of the transistors is substantially greater than the threshold voltage (typically 5 to 15 volts above the threshold voltage). In order to do this, control means 50 preferably include two charge pumps 510 and 520 respectively connected to gates 211 and 221 of MOFSET power transistors 210 and 220. These charge pumps are well known in the art and generate a higher output voltage than their input voltage. Typically, these charge pumps are able to double or triple their input voltage. It is to be noted that this type of device is also known by the name of voltage doubler or tripler. In the application example used here, it will be mentioned that the charge pumps are thus typically adapted to triple an input voltage $V_{dd}$ defined as the voltage of the rechargeable battery.

Figure 3:
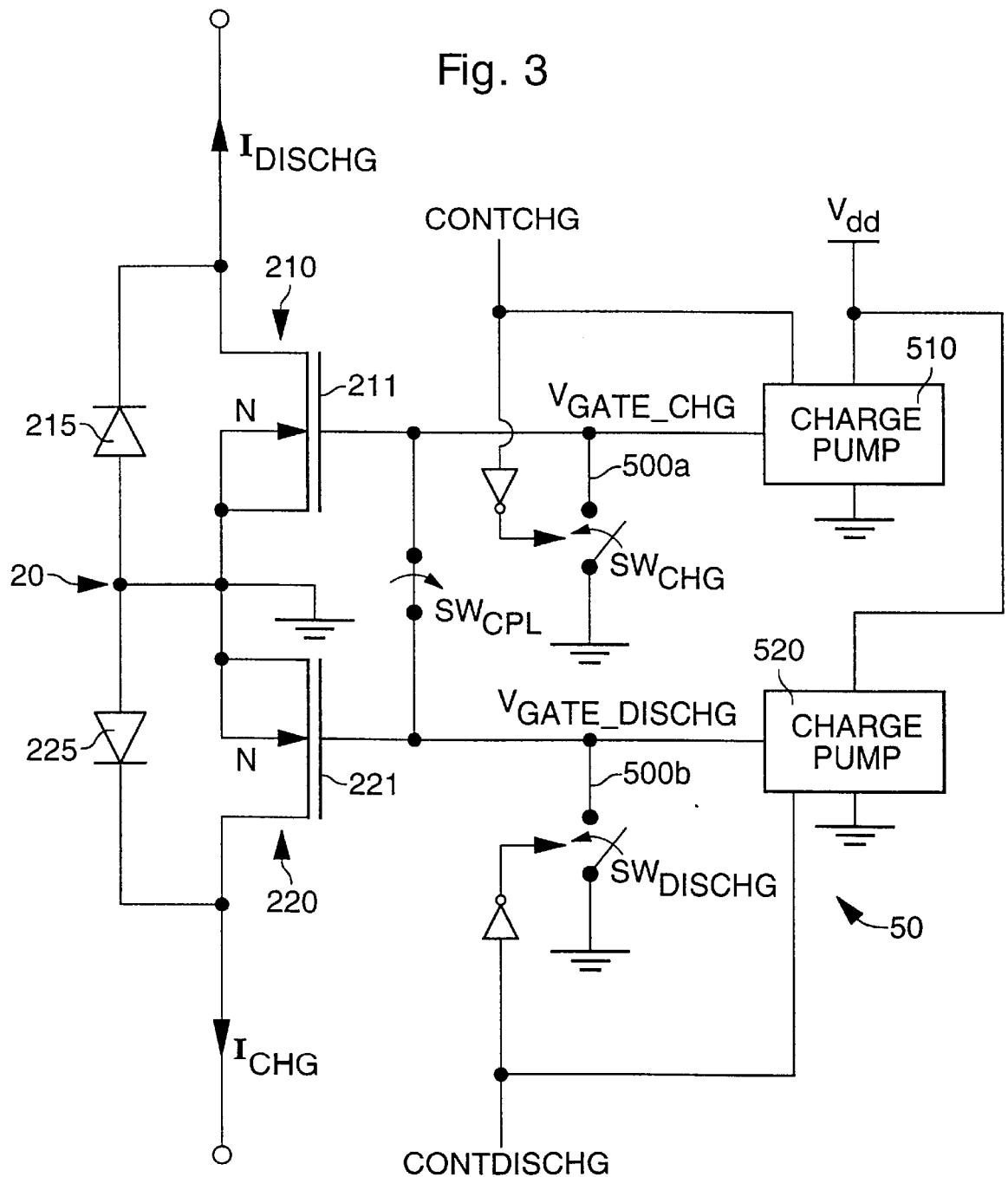
FIG. 3 illustrates an operating diagram of the control system for a bidirectional switch with two transistors according to the present invention.

As is illustrated in FIG. 3, two blocking switches $SW_{CHG}$ and $SW_{DISCHG}$ arranged respectively in first and second branches 500a and 500b allow each of gates 211 and 221 to be connected to earth in order, if required, to set the corresponding power transistor to the "OFF" state. It will be mentioned however that it is perfectly possible to envisage additionally or alternatively that charge pumps 510 and 520 are deactivated when the corresponding transistor has to be set to the "OFF" state. Blocking switches $SW_{CHG}$ and $SW_{DISCHG}$ can then be directly integrated in charge pumps 510 and 520.

According to an essential feature of the present invention, control means 50 further include coupling means connected between gates 211 and 221 of MOFSET power transistors 210 and 220. These coupling means can easily be made in the form of a coupling switch $SW_{CPL}$ adapted to connect gates 211 and 221 of the power transistors, as is illustrated in FIG. 3.

According to the present invention, this coupling switch $SW_{CPL}$ is adapted to couple, at least temporarily, gates 211 and 221 of power transistors 210 and 220 when one or the other of these transistors, which had previously been set to the "OFF" state to interrupt the flow of a current, has to be reset to the "ON" state.

By coupling, at least temporarily, gates 211 and 221 of MOFSET power transistors 210 and 220 when the transistor at the "OFF" state is again made to conduct, the charges present on the transistor gate which remained at the "ON" state are shared with the other transistor and it is thus possible to substantially reduce the conduction delay time of this transistor and thereby the conduction delay time or switching to the "ON" state time of bidirectional switch 20. According to the present invention, advantage is thus taken of the fact that only one of MOFSET power transistors 210 or 220 is set to the "OFF" state when one wishes to interrupt the flow of the current through the battery, the other transistor always remaining in the "ON" state.

In order to take advantage of this fact, the gates of the power transistors have to be connected at least temporarily for a sufficient time interval for the power transistor which was at the "OFF" state to become conductive again. It will be understood however that the gates of MOFSET power transistors 210 and 220 can perfectly well be permanently coupled to each other for as long as it is desirable to keep both transistors at the "ON" state. Of course, these coupling means must necessarily be adapted to uncouple the transistor gates when one of power transistors 210 or 220 of bidirectional switch 20 has to be made non-conductive.

According to this principle, it will be understood that coupling switch $SW_{CPL}$ forming the coupling means can be controlled by a control signal formed of a logic combination of the activation signals respectively controlling switches $SW_{CHG}$ and $SW_{DISCHG}$. Thus, if one assumes that the activation signals CONTCHG and CONTDISCHG are used to control respectively switches $SW_{CHG}$ and $SW_{DISCHG}$, these activation signals being at the "high" logic state when the power transistors have to be set to the "ON" state, the control signal of coupling switch $SW_{CPL}$ can be defined as the AND logic combination of these activation signals CONTCHG and CONTDISCHG.

It will be mentioned that switches $SW_{CPL}$, $SW_{CHG}$ and $SW_{DISCHG}$ have to be adapted to switch between relatively high voltages (of the order of the gate voltage applied to power transistors 210 and 220, namely ten or so volts). One may envisage making these switches by means of MOFSET transistors adapted to resist such switching voltages. However, it will be understood that the response time of coupling switch $SW_{CPL}$ is determining for the time it takes bidirectional switch 20 to switch to the "ON" state. It is thus preferable to minimise the time it takes coupling switch $SW_{CPL}$ to switch to the "ON" state, i.e. to use low voltage MOFSET transistors having a low gate capacitance.

Figure 4:
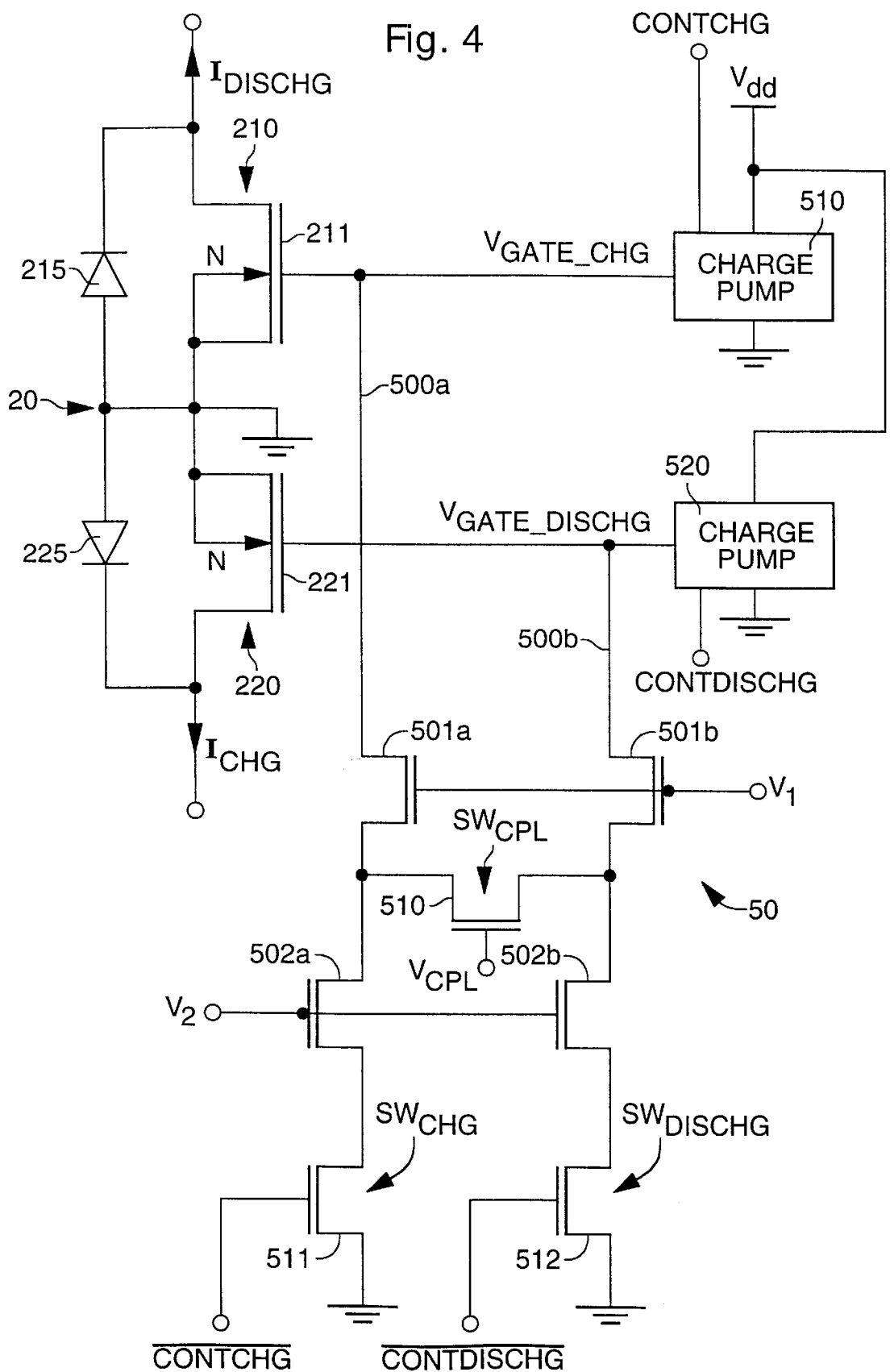
FIG. 4 illustrates an embodiment in low voltage CMOS technology of a control system for a bidirectional switch with two transistors according to the present invention.

In order to make the control system according to the present invention using low voltage CMOS technology, several modifications must thus be made to the system which has just been described. FIG. 4 illustrates an embodiment of a control system for a bidirectional switch with two transistors made using low voltage CMOS technology. Identical numerical references have been used in this Figure to designate the elements common to this embodiment and to the operating diagram of FIG. 3.

With reference to FIG. 4, bidirectional switch 20 formed of the pair of N-MOFSET power transistors 210 and 220 is thus controlled by control means 50 including in particular charge pumps 510 and 520 respectively supplying equivalent gate voltages $V_{GATE\_CHG}$ and $V_{GATE\_DISCHG}$, in this embodiment, at three times input voltage $V_{dd}$ supplied by the battery.

According to this embodiment, the first branch 500a including blocking switch $SW_{CHG}$ allows gate 211 of MOFSET power transistor 210 to be earthed in order to set it to the "OFF" state. Likewise, the second branch 500b including blocking switch $SW_{DISCHG}$ allows gate 221 of MOFSET power transistor 220 to be earthed in order to set it to the "OFF" state. Blocking transistors $SW_{CHG}$ and $SW_{DISCHG}$ are formed of MOFSET transistors 511 and 512, respectively, one of whose terminals is connected to earth. The gates of these MOFSET transistors 511 and 512 are respectively controlled by inverted activation signals CONTCHG and CONTDISCHG.

Branches 500a and 500b each further include first and second protective transistors 501 a and 502a, respectively, 501 a and 501b, connected in series between the gate of the corresponding MOFSET power transistor and the corresponding blocking switch, namely respectively between gate 211 of power transistor 210 and switch $SW_{CHG}$ on the one hand, and between gate 221 of power transistor 220 and switch $SW_{DISCHG}$ on the other hand.

The gates of first protective transistors 501a and 501b are connected to each other and controlled by a first control voltage $V_1$. The gates of second protective transistors 502a and 502b are connected to each other and controlled by a second control voltage $V_2$.

Coupling switch $SW_{CPL}$ formed in this example by a MOFSET coupling transistor 510, is connected between the connection node of first and second protective transistors 501a and 502a of first branch 500a, and the connection node of first and second protective transistors 501b and 502b of second branch 500b. The gate of coupling transistor 510 forming the coupling switch is controlled by a control voltage $V_{CPL}$ representing activation signals CONTCHG and CONTDISCHG of blocking switches $SW_{CHG}$ and $SW_{DISCHG}$. In this embodiment, this control voltage $V_{CPL}$ is substantially 0 so as to uncouple gates 211 and 221 of power transistors 210 and 220 when one of activation signals CONTCHG and CONTDISCHG indicates that one of these power transistors has to be set to the "OFF" state. Conversely, in order to couple gates 211 and 221 of power transistors 210 and 220 so as to allow the blocked transistor to be rapidly switched on, control voltage $V_{CPL}$ of the gate of coupling transistor 510 is brought to a value substantially equal to the gate voltage of power transistors 210 and 220.

In order to assure that none of the transistors forming control means 50 has too high a voltage across its terminals, the gates of first protective transistors 501a and 501b as well as the gates of second protective transistors 502a and 502b are controlled in the following manner.

In normal operation, i.e. when both MOFSET power transistors 210 and 220 forming bidirectional switch 20 are at the "ON" state (CONTCHG=CONTDISCHG=1), first control voltage $V_1$ of first protective transistors 501a and 501b is brought to a value substantially equal to the gate voltage of power transistors 210 and 220, i.e. approximately three times the input voltage $V_{dd}$. Second control voltage $V_2$ of second protective transistors 502a and 502b is brought to a value substantially equal to twice input voltage $V_{dd}$.

When one or the other of MOFSET power transistors 210 or 220 has to set to the "OFF" state in order to interrupt the flow of a current through bidirectional switch 20 (CONTCHG="0" or CONTDISCHG="0"), first control voltage $V_1$ is reduced to a voltage substantially equal to twice input voltage $V_{dd}$, while second control voltage $V_2$ is reduced to a voltage substantially equal to input voltage $V_{dd}$.

This control method for the gates of protective transistors 501 a, 502a, 501 b and 502b thus ensures that none of the transistors has too high a voltage across its terminals, which could lead to the breakdown thereof.

FIGS. 5a to 5d illustrate four diagrams of the evolution of the various control voltages of the control system of FIG.

4 in response to activation signals CONTCHG and CONTDISCHG, allowing the beneficial effects of the present invention to be seen. A situation is shown here in which the bidirectional switch blocks, in a first period (phase A in the Figures), the continuation of the battery discharge (CONTCHG="1"; CONTDISCHG="0"), then in a second period (phase B), is rest to normal operation (CONTCHG= CONTDISCHG="1"), and, in a third period (phase C), again blocks the continuation of the discharge (CONTCHG="1", CONTDISCHG="0").

Figure 5A:
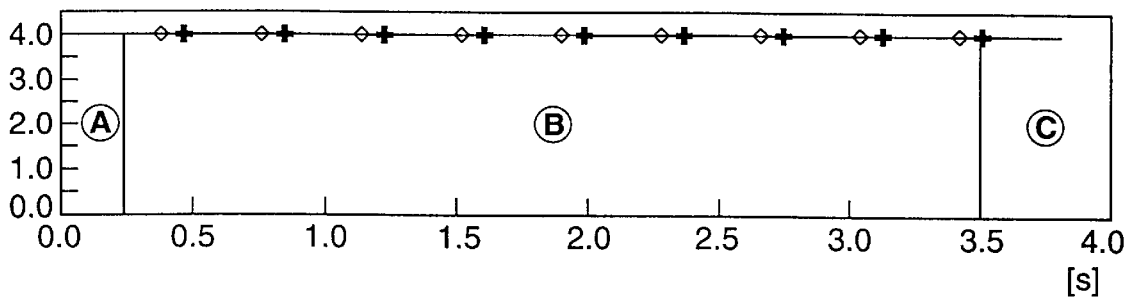
FIGS. 5a to 5d illustrate a set of diagrams of the evolution of the control voltages of the control system illustrated in FIG. 4, allowing the beneficial effects of the present invention to be shown.
Figure 5B:
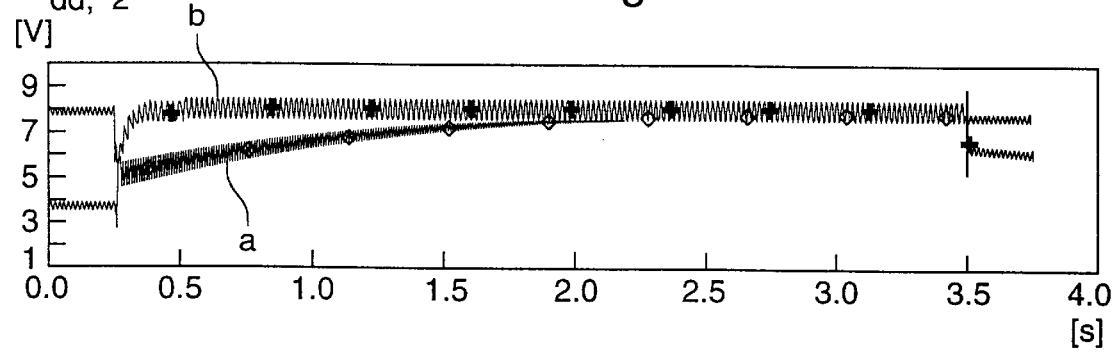
Figure 5C:
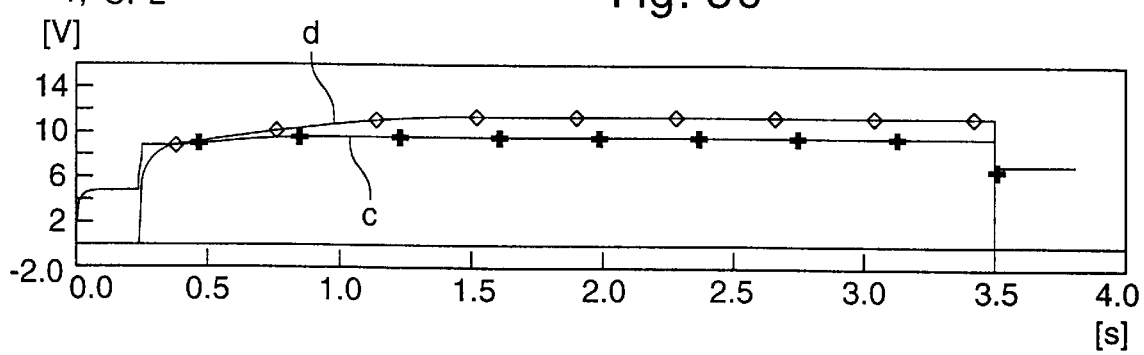
Figure 5D:
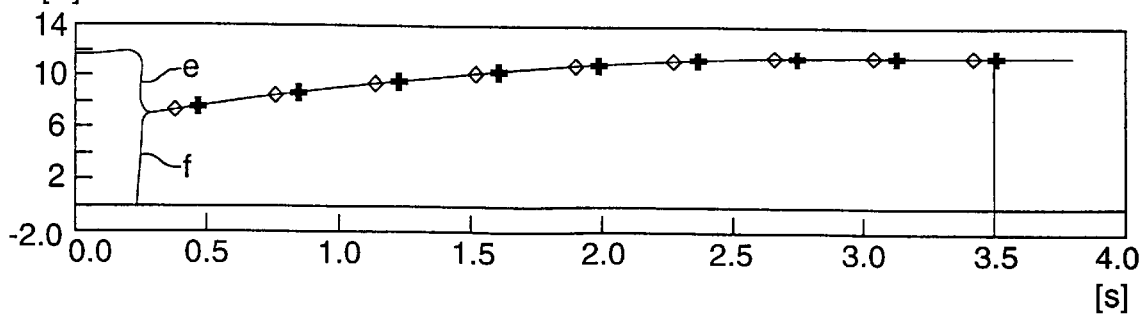

FIG. 5a thus shows a first diagram in which activation signals CONTCHG and CONTDISCHG are illustrated. FIG. 5b shows a second diagram illustrating a first curve a representative of the evolution of the double of voltage $V_{dd}$ supplied by the battery and a second curve b representative of the evolution of second control voltage $V_2$ of second protective transistors 502a and 502b of FIG. 4. FIG. 5c shows a third diagram illustrating a third curve c representative of the evolution of first control voltage $V_1$ of first protective transistors 501a and 501b of FIG. 4, and a fourth curve d representative of the evolution of control voltage $V_{CPL}$ of coupling transistor 510. FIG. 5d shows a fourth diagram illustrating fifth and sixth curves e and f respectively representative of the evolution of gate voltages $V_{GATE\_CHG}$ and $V_{GATE\_DISCHG}$ of MOFSET power transistors 210 and 220.

It is thus to be noted in these Figures that during phase A and phase C (CONTCHG="1"; CONTDISCHG="0"), gate voltage $V_{GATE\_DISCHG}$ of MOFSET power transistor 220 is substantially equal to 0 so that this transistor is set at the "OFF" state in order to interrupt any continuation of the battery discharge. MOFSET power transistor 210 is kept at the "ON" state by applying gate voltage $V_{GATE\_CHG}$ equivalent to approximately three times voltage $V_{dd}$. In this case, as mentioned hereinbefore, first and second control voltages $V_1$ and $V_2$ have a value of approximately twice and respectively once voltage $V_{dd}$. Control voltage $V_{CPL}$ of coupling transistor 510 is kept substantially at 0 so that the gates of MOFSET power transistors 210 and 220 of FIG. 4 are kept uncoupled.

During transition to phase B (CONTCHG= CONTDISCHG="1"), control voltage $V_{CPL}$ of coupling transistor 510 passes to approximately three times voltage $V_{dd}$ so that the gates of MOFSET power transistors 210 and 220 are coupled. Simultaneously, first and second control voltages $V_1$ and $V_2$ of the protective transistors pass respectively to three and two times voltage $V_{dd}$. As is clear from the diagram of FIG. 5d, it follows that the charges present on the gate of MOFSET power transistor 210 which remained at the "ON" state are shared with MOFSET power transistor 220. The gate of MOFSET power transistor 220 is thus very rapidly charged to a sufficient level to make it conductive by the transfer of a portion of the charges of MOFSET power transistor 210 which remained at the "ON" state. Since the conduction threshold of the MOFSET power transistors is located at approximately 1 volt, it will thus be noted that MOFSET power transistor 220 is set to the "ON" state practically instantaneously. Once the gates are coupled, the charge of the gates of the MOFSET power transistors represented by curves e and f of FIG. 5d follow a normal evolution.

Everything which has just been described may of course apply in a similar manner in the situation in which the bidirectional switch blocks the continuation of the battery charge, i.e. the situation in which MOFSET power transistor 210 is set at the "OFF" state (CONTCHG="0", CONTDISCHG="1").

It will also be easily understood that the control system according to the invention may be subject to numerous modifications and/or improvements without departing from the scope of the claims. In particular, those skilled in the art are perfectly capable of modifying the control system according to the present invention to adapt it to lower or higher control voltages according to the particular application. It will be recalled moreover, that the control system for a bidirectional switch according to the present invention may also be applied to different circuits to the protective battery circuits which were taken here as examples.

What is claimed is:

1. A control system for a bidirectional switch formed of a pair of MOFSET power transistors mounted in anti-series source to source or drain to drain, this control system including control means allowing the state of conduction of said power transistors to be controlled, one or the other of said power transistors being able to be set to the "OFF" state in order to assure the interruption of a current through said switch, wherein this control system includes coupling means enabling the gate of the power transistor at the "ON" state to be coupled at least temporarily with the gate of the power transistor at the "OFF" state when said switch is switched on.

2. The control system according to claim 1, wherein said coupling means permanently couples the gates of said power transistors when the latter are at the "ON" state.

3. The control system according to claim 1, wherein said control means include two charge pumps respectively connected to the gates of said power transistors and first and second branches respectively connected to the gates of said power transistors and each including a blocking transistor enabling the corresponding power transistor to be set to the "OFF" state.

4. The control system according to claim 3, wherein each of said branches further includes first and second protective transistors connected in series between the gate of the corresponding power transistor and the blocking switch, said coupling means being connected between the connection node of the first and second protective transistors of the first branch, and the connection node of the first and second protective transistors of the second branch.

5. The control system according to claim 3, wherein said blocking switches are MOFSET transistors.

6. The control system according to claim 1, wherein said coupling means is a MOFSET transistor.

7. A control method for a bidirectional switch formed of a pair of MOFSET power transistors mounted in anti-series source to source or drain to drain, and controlled by control means, one or the other of said power transistors being able to be 30 set to the "OFF" state in order to assure the interruption of a current through said switch, wherein, when said switch is switched on, the gate of the power transistor at the "ON" state is at least temporarily coupled with the gate of the power transistor at the "OFF" state.

8. The control method according to claim 7, wherein the gates of said power transistors are permanently coupled when the latter are at the "ON" state.

* * * * *